US010832916B1

(12) United States Patent
Xie et al.

(10) Patent No.: US 10,832,916 B1
(45) Date of Patent: Nov. 10, 2020

(54) SELF-ALIGNED GATE ISOLATION WITH ASYMMETRIC CUT PLACEMENT

(71) Applicant: International Business Machines Corporation, Armonk, NY (US)

(72) Inventors: Ruilong Xie, Niskayuna, NY (US); Carl Radens, LaGrangeville, NY (US); Kangguo Cheng, Schenectady, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/511,640

(22) Filed: Jul. 15, 2019

(51) Int. Cl.
*H01L 21/00* (2006.01)
*H01L 27/00* (2006.01)
(Continued)

(52) U.S. Cl.
CPC .. *H01L 21/28123* (2013.01); *H01L 21/02532* (2013.01); *H01L 21/02603* (2013.01); *H01L 21/823807* (2013.01); *H01L 21/823828* (2013.01); *H01L 21/823878* (2013.01); *H01L 27/092* (2013.01); *H01L 27/1108* (2013.01); *H01L 27/1116* (2013.01);
(Continued)

(58) Field of Classification Search
CPC ......... H01L 21/28123; H01L 21/02532; H01L 21/02603; H01L 21/823807; H01L 21/823828; H01L 21/823878; H01L 27/092; H01L 27/1108; H01L 27/1116; H01L 29/0649; H01L 29/0673; H01L 29/42392; H01L 29/66545; H01L 29/78606; H01L 29/78696
See application file for complete search history.

(56) References Cited

U.S. PATENT DOCUMENTS 6,100,123 A    8/2000  Bracchitta et al.
7,101,762 B2   9/2006  Cohen et al.
(Continued)

FOREIGN PATENT DOCUMENTS

WO    2018004680 A1    1/2018
WO    2018063365 A1    4/2018

*Primary Examiner* — Nikolay K Yushin
(74) *Attorney, Agent, or Firm* — Douglas Pearson; Ryan, Mason & Lewis, LLP

(57) ABSTRACT

A method of forming a semiconductor structure includes forming fins over a substrate, forming a shallow trench isolation region over the substrate surrounding the fins, and forming nanosheet stacks providing channels for nanosheet field-effect transistors. The method also includes forming a channel protecting liner over a portion of sidewalls and a top surface of a first nanosheet stack formed over a first fin, the channel protecting liner being further formed over a portion of the shallow trench isolation region extending from the sidewalls of the first nanosheet stack toward a second nanosheet stack formed over a second fin. The method further includes forming gate stacks surrounding exposed portions of the nanosheet stacks, forming an asymmetric self-aligned gate isolation structure over the channel protecting liner, and forming a symmetric self-aligned gate isolation structure over a portion of the shallow trench isolation region between a third fin and a fourth fin.

25 Claims, 16 Drawing Sheets

(51) Int. Cl.
  *H01L 29/00*      (2006.01)
  *H01L 21/28*      (2006.01)
  *H01L 21/8238*    (2006.01)
  *H01L 27/11*      (2006.01)
  *H01L 27/092*     (2006.01)
  *H01L 29/06*      (2006.01)
  *H01L 29/423*     (2006.01)
  *H01L 29/786*     (2006.01)
  *H01L 29/66*      (2006.01)
  *H01L 21/02*      (2006.01)

(52) U.S. Cl.
  CPC ...... *H01L 29/0649* (2013.01); *H01L 29/0673* (2013.01); *H01L 29/42392* (2013.01); *H01L 29/66545* (2013.01); *H01L 29/78606* (2013.01); *H01L 29/78696* (2013.01)

(56) References Cited

U.S. PATENT DOCUMENTS

| | | |
|---|---|---|
| 7,223,650 B2 | 5/2007 | Chang |
| 8,216,903 B2 | 7/2012 | Houston et al. |
| 9,373,641 B2 | 6/2016 | Anderson et al. |
| 9,425,291 B1 * | 8/2016 | Balakrishnan .... H01L 29/66795 |
| 9,685,539 B1 * | 6/2017 | Cheng ............... H01L 29/66795 |
| 9,842,914 B1 * | 12/2017 | Yeung ................ H01L 29/6681 |
| 9,960,077 B1 | 5/2018 | Zang et al. |
| 9,984,936 B1 * | 5/2018 | Xie ....................... H01L 29/775 |
| 10,177,037 B2 | 1/2019 | Zang et al. |
| 10,332,803 B1 * | 6/2019 | Xie ..................... H01L 29/0649 |
| 10,367,061 B1 * | 7/2019 | Loubet ............... H01L 29/0653 |
| 2016/0233298 A1 | 8/2016 | Webb et al. |
| 2020/0013791 A1 * | 1/2020 | Or-Bach ........... H01L 29/42332 |

* cited by examiner

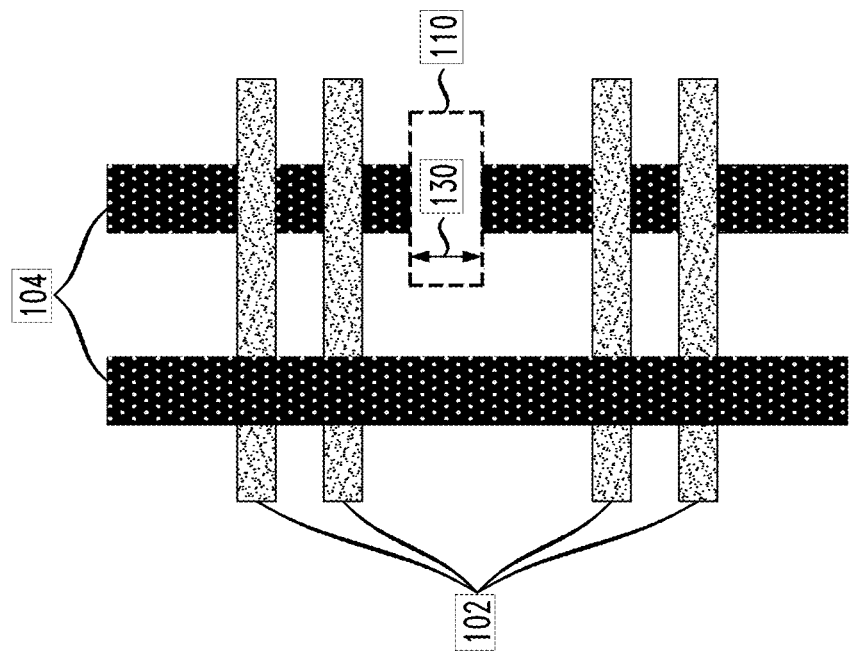
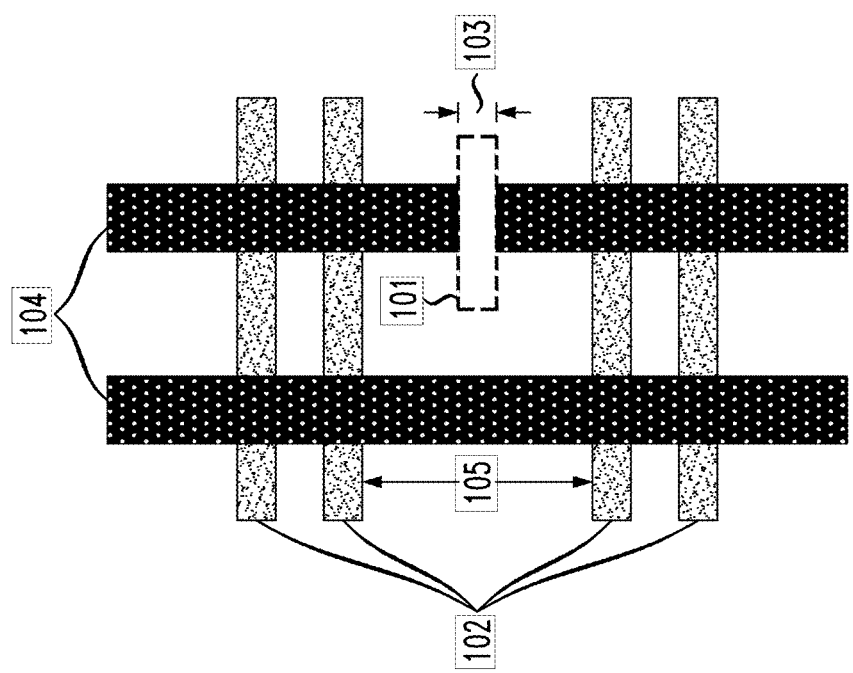

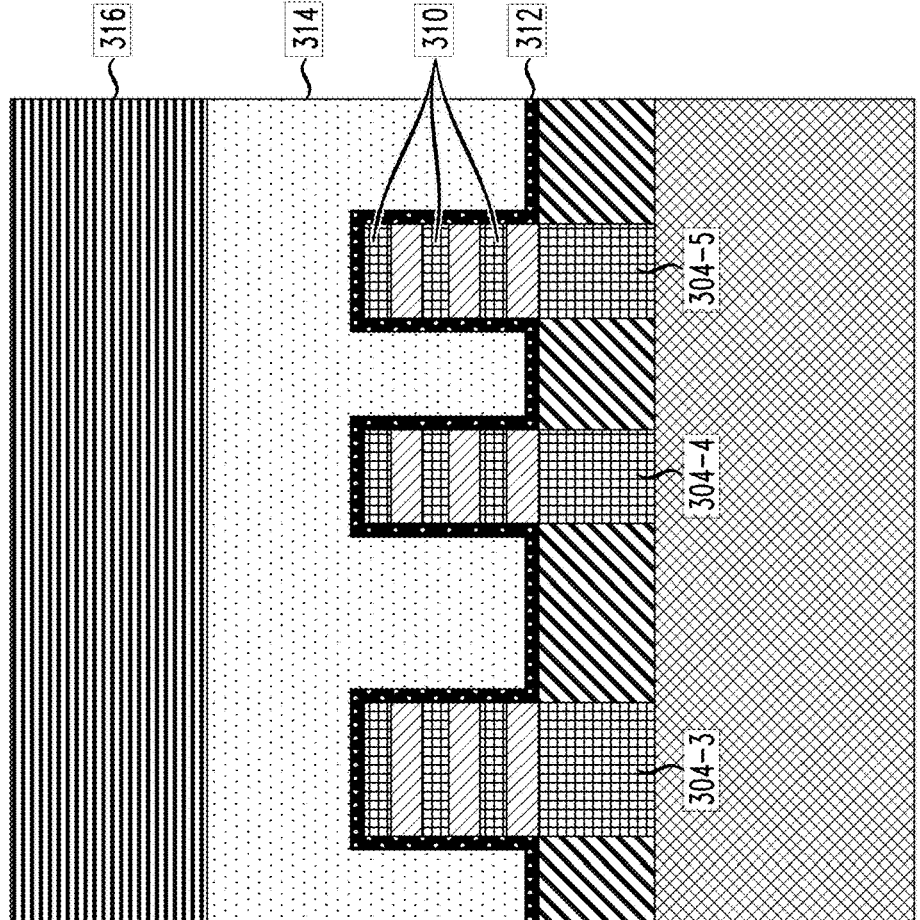
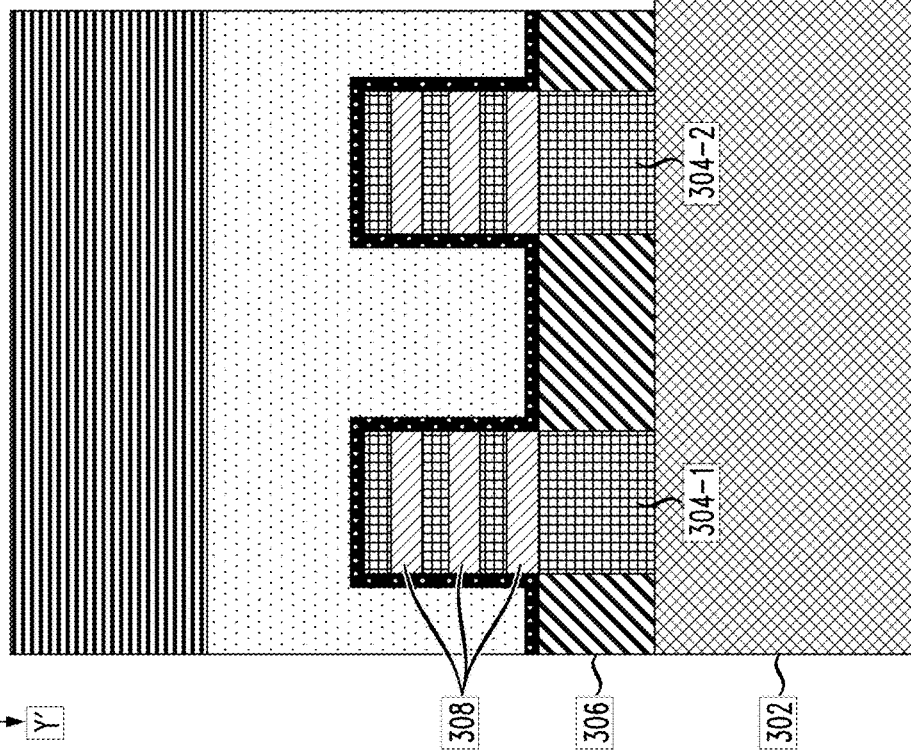
FIG. 4

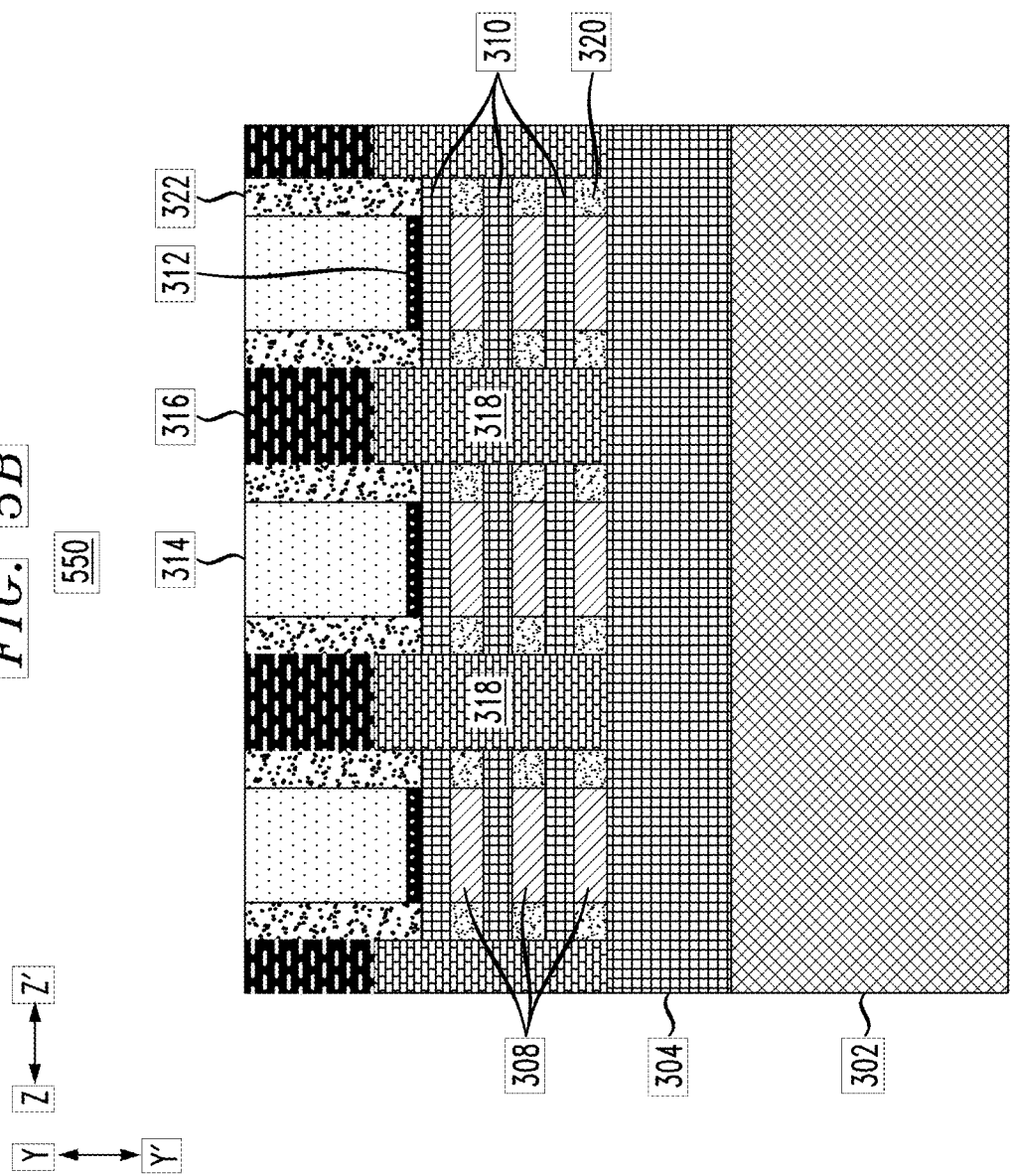

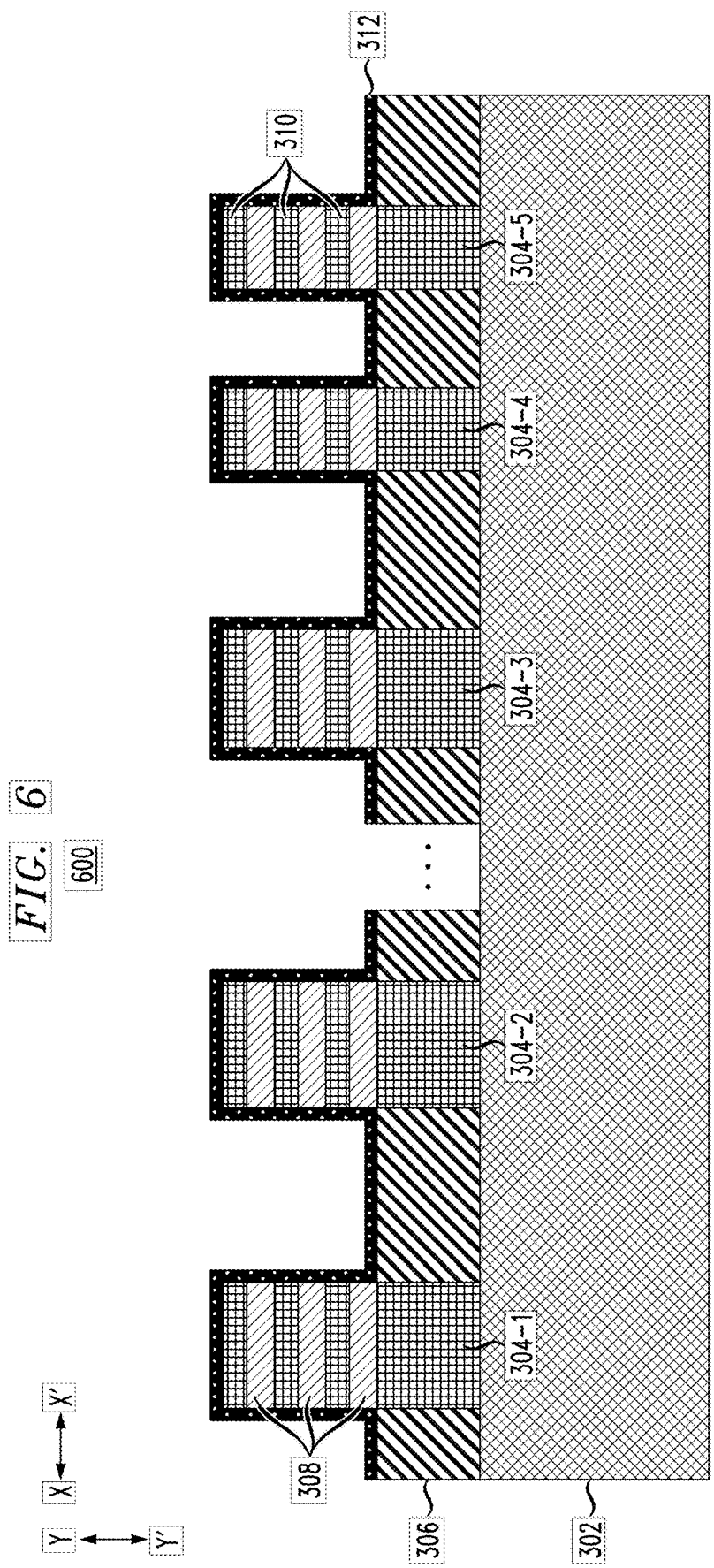

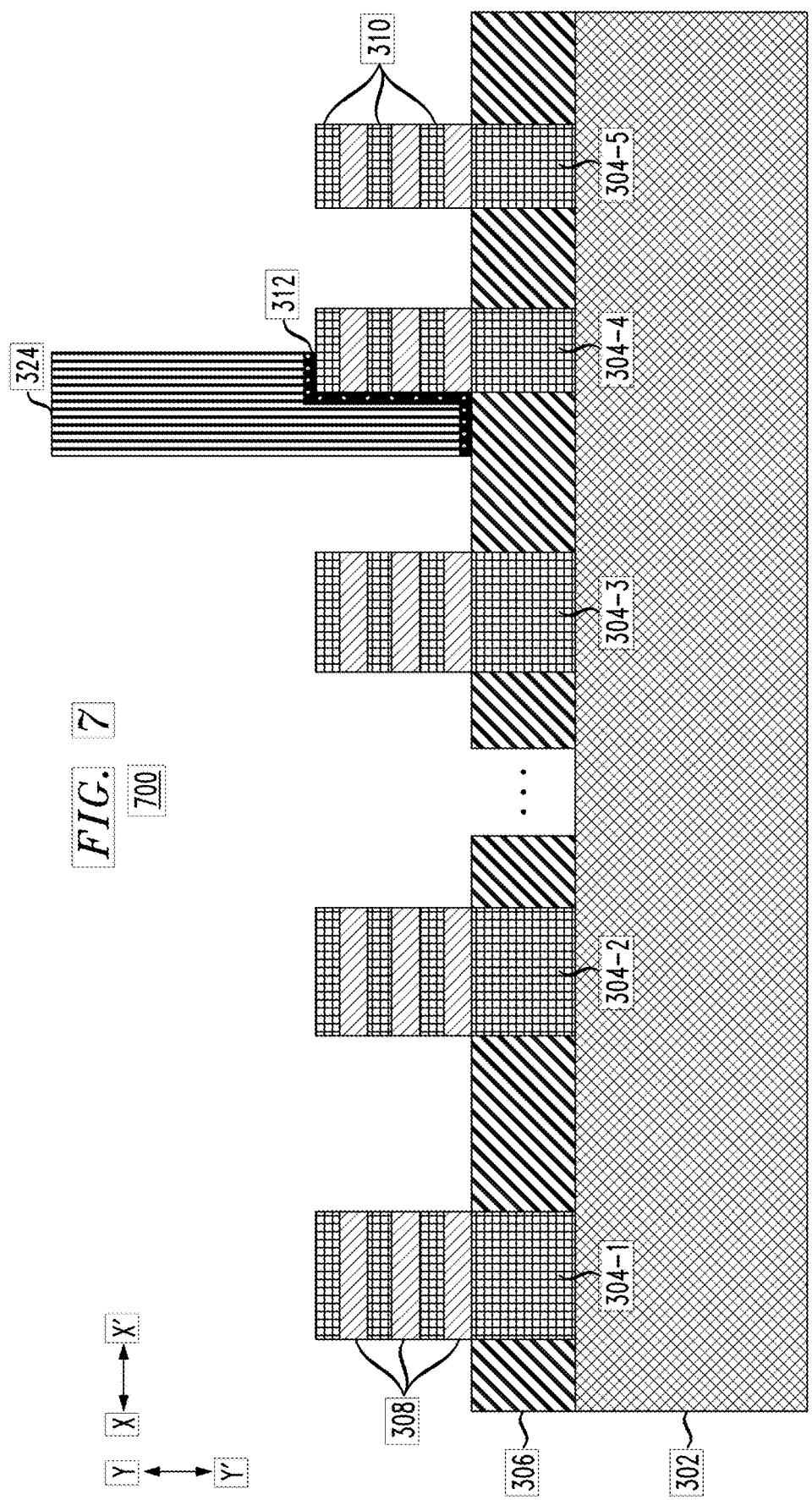

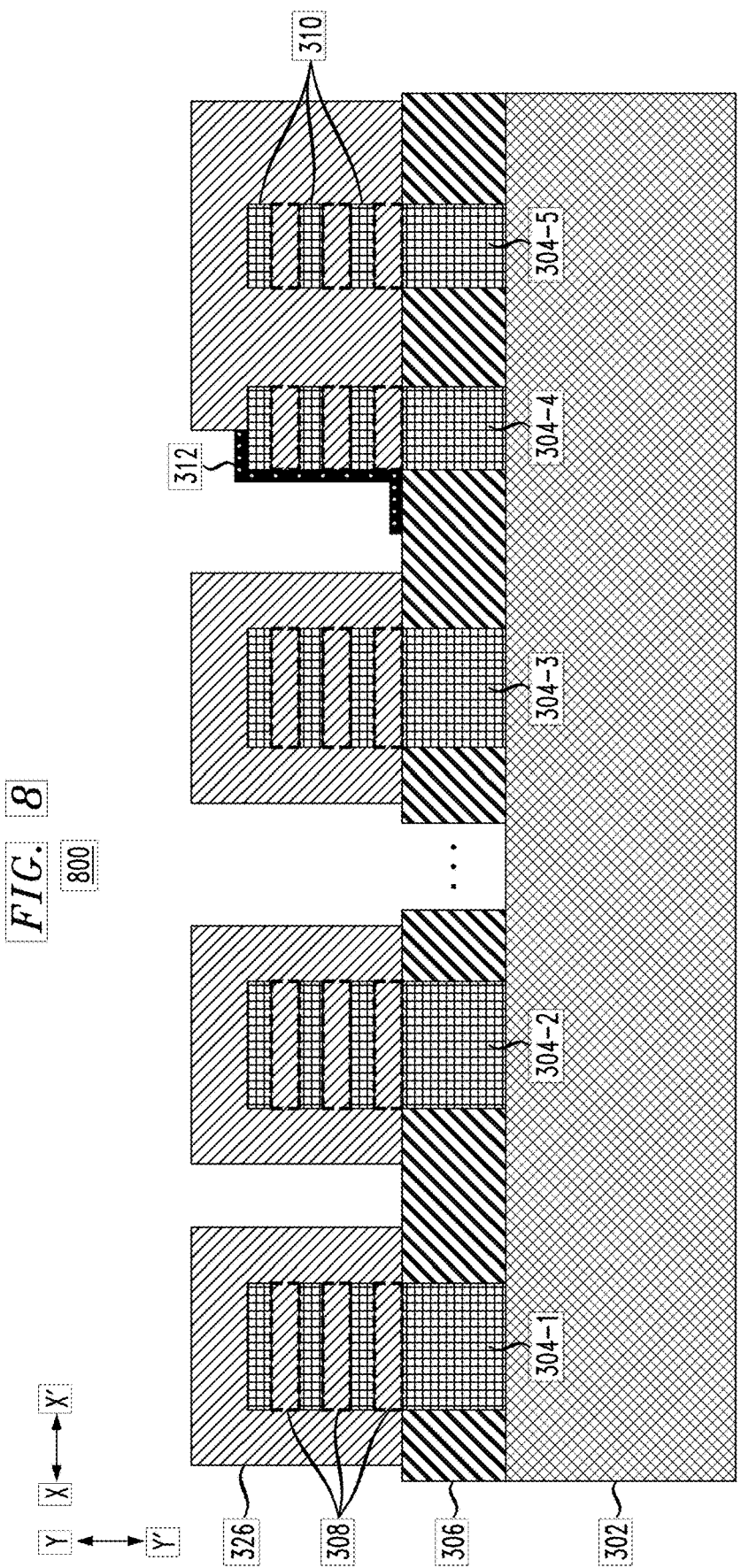

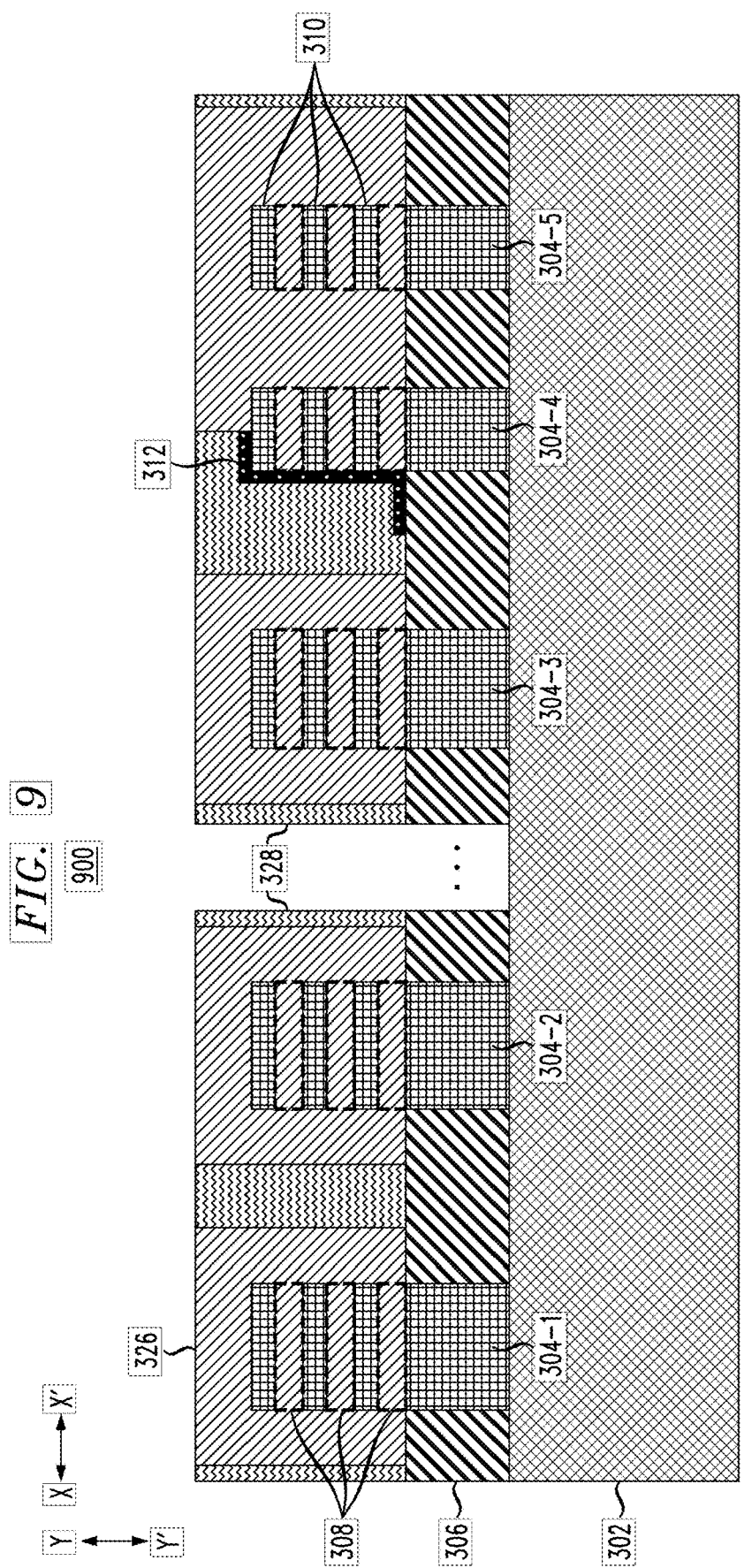

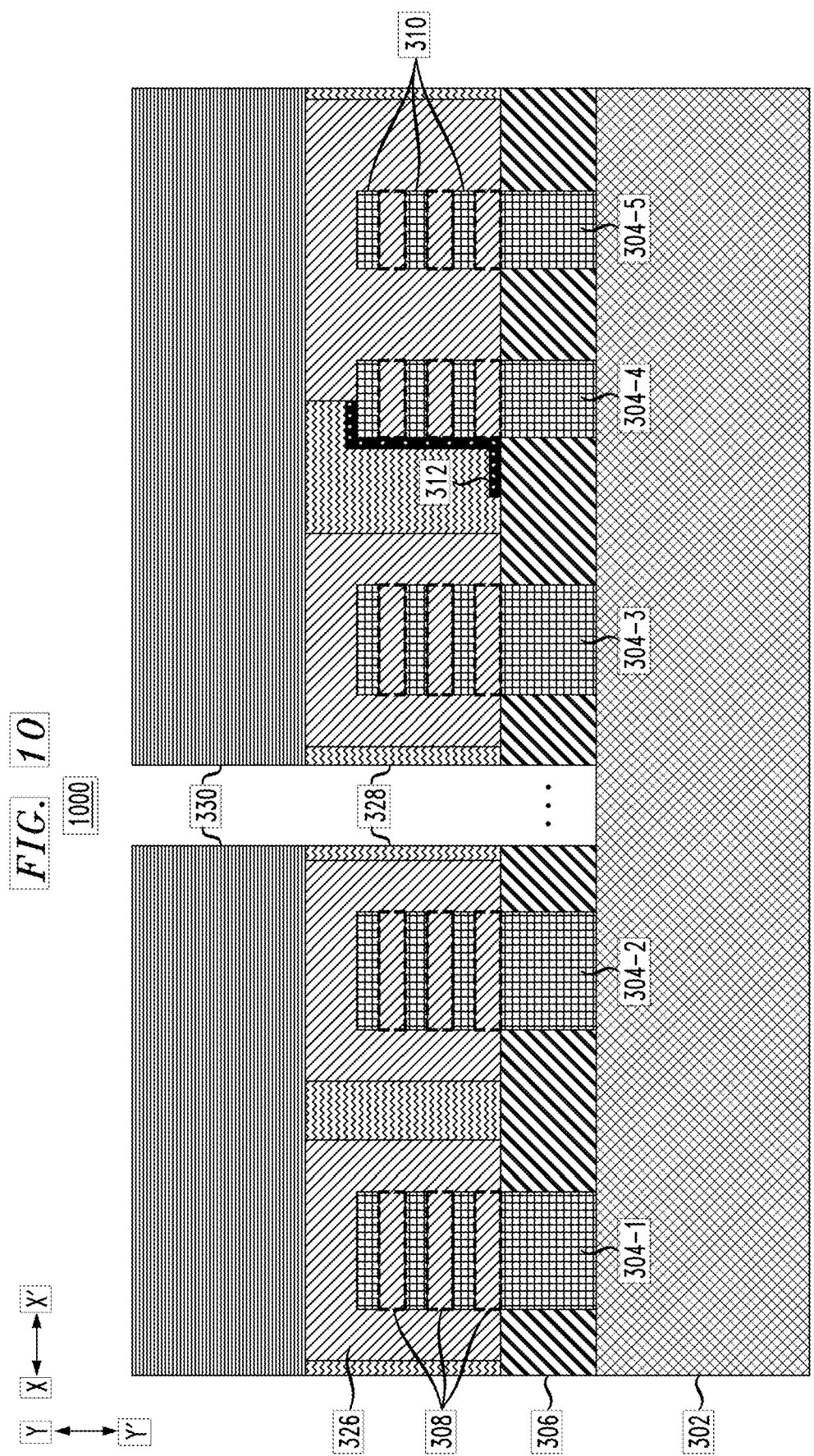

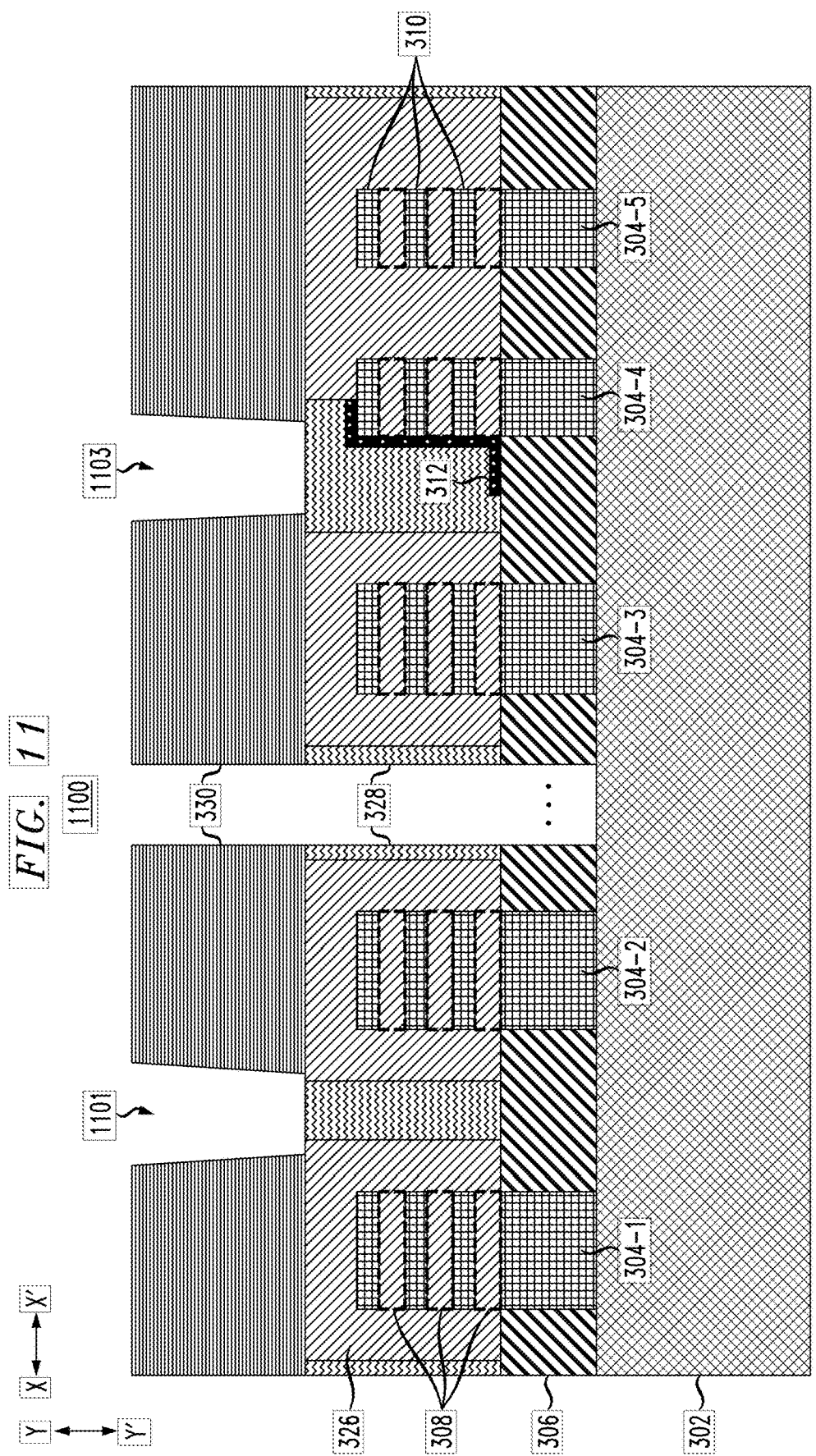

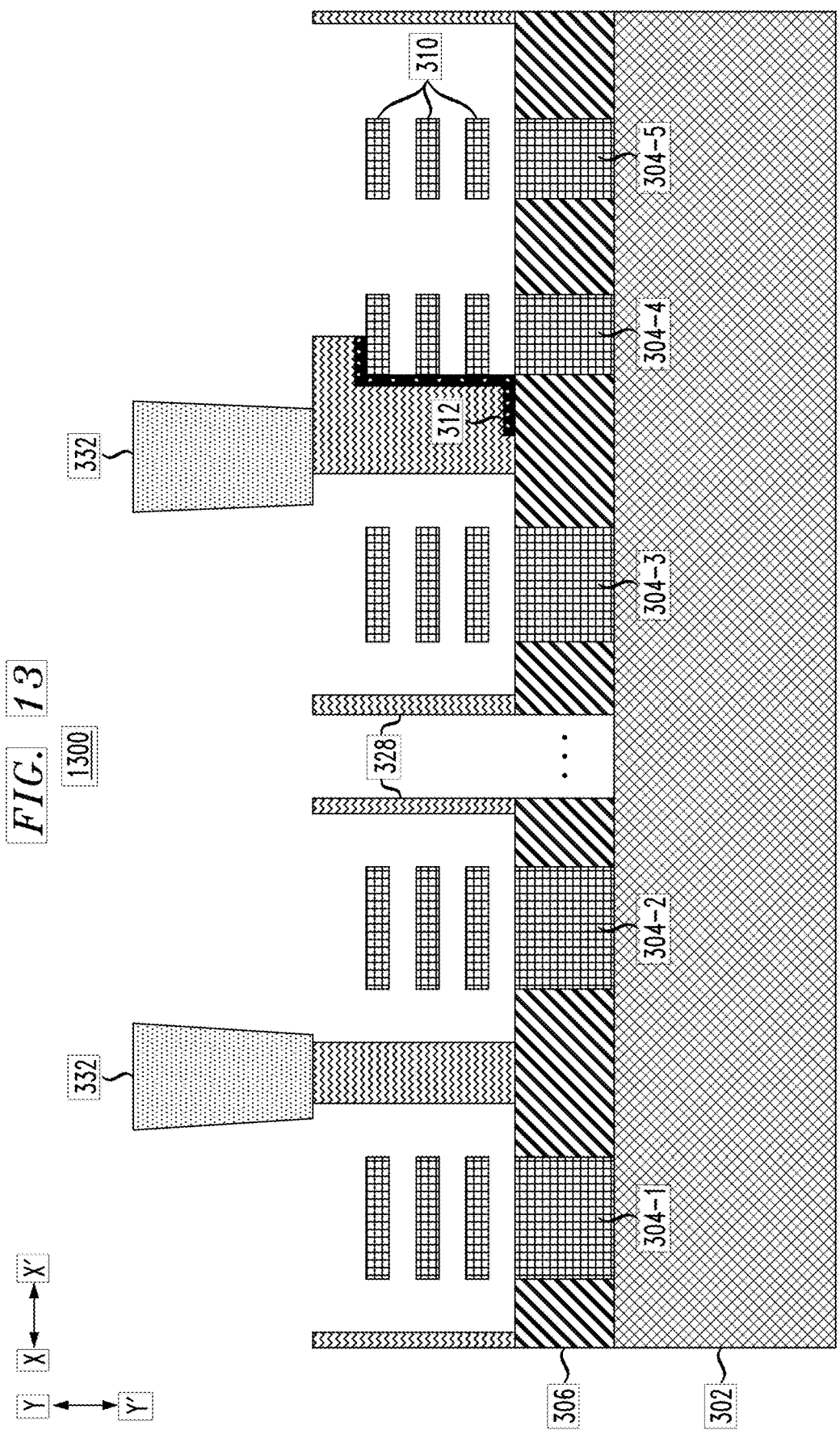

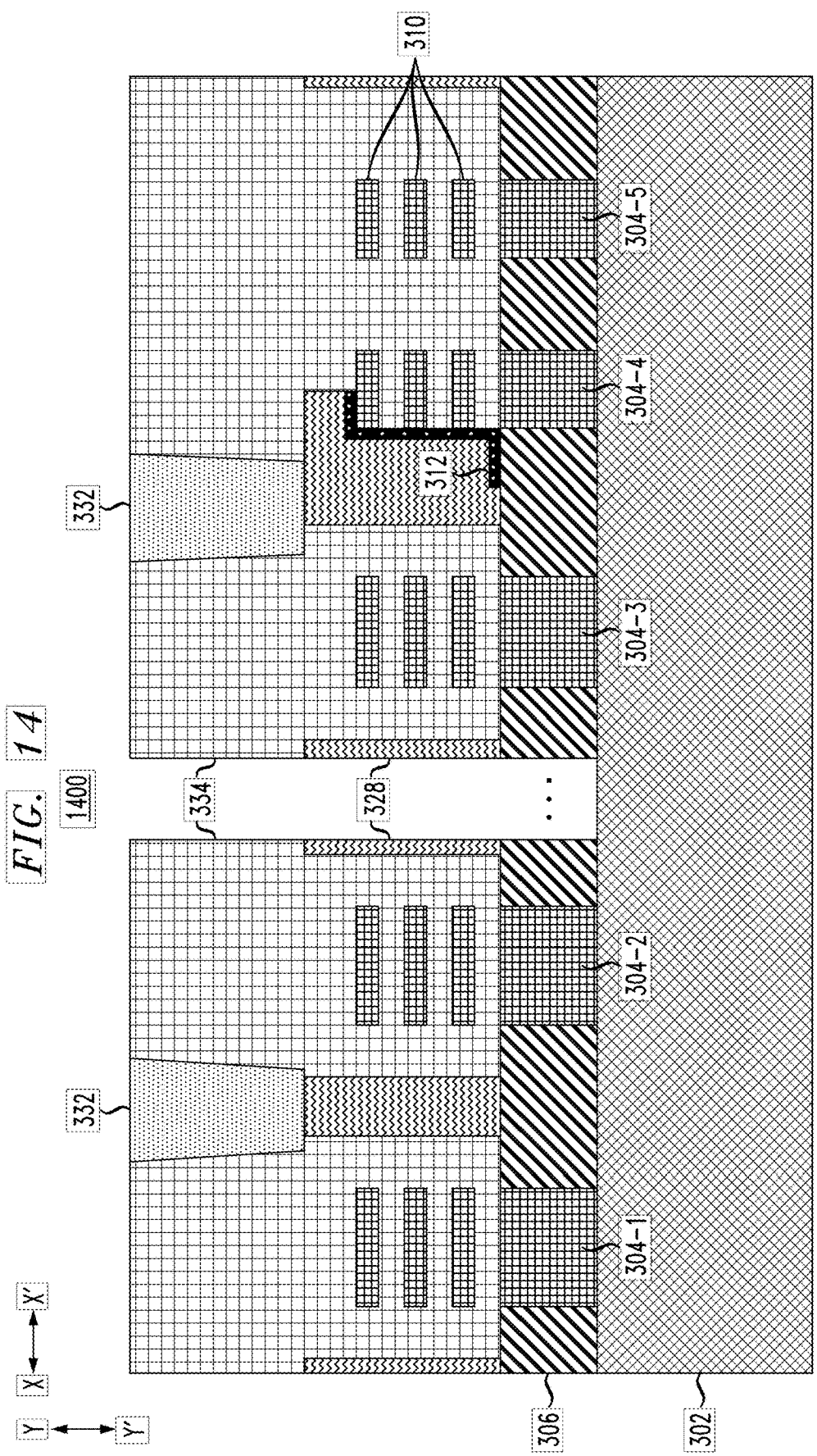

US 10,832,916 B1

SELF-ALIGNED GATE ISOLATION WITH ASYMMETRIC CUT PLACEMENT

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field effect transistors (FETs), and capacitors.

SUMMARY

Embodiments of the invention provide techniques for forming self-aligned gate isolation structures with both symmetric and asymmetric cut placements.

In one embodiment, a method of forming a semiconductor structure comprises forming a plurality of fins over a top surface of a substrate, forming a shallow trench isolation region over the top surface of the substrate surrounding the plurality of fins, and forming a plurality of nanosheet stacks of channel material over the plurality of fins, the plurality of nanosheet stacks providing channels for one or more nanosheet field-effect transistors. The method also comprises forming a channel protecting liner over at least a portion of sidewalls and a top surface of a first one of the plurality of nanosheet stacks formed over a first one of the plurality of fins, the channel protecting liner being further formed over a portion of the shallow trench isolation region extending from the portion of the sidewalls of the first nanosheet stack toward a second one of the plurality of nanosheet stacks formed over a second one of the plurality of fins. The method further comprises forming a plurality of gate stacks surrounding portions of the plurality of nanosheet stacks exposed by the channel protecting liner, forming at least one asymmetric self-aligned gate isolation structure over the channel protecting liner, and forming at least one symmetric self-aligned gate isolation structure over a portion of the shallow trench isolation region between a third one of the plurality of fins and a fourth one of the plurality of fins.

In another embodiment, a semiconductor structure comprises a substrate, a plurality of fins disposed over a top surface of the substrate, a shallow trench isolation region disposed over the top surface of the substrate surrounding the plurality of fins, and a plurality of nanosheet stacks of channel material disposed over the plurality of fins, the plurality of nanosheet stacks providing channels for one or more nanosheet field-effect transistors. The semiconductor structure also comprises a channel protecting liner disposed over at least a portion of sidewalls and a top surface of a first one of the plurality of nanosheet stacks disposed over a first one of the plurality of fins, the channel protecting liner being further disposed over a portion of the shallow trench isolation region extending from the portion of the sidewalls of the first nanosheet stack toward a second one of the plurality of nanosheet stacks disposed over a second one of the plurality of fins. The semiconductor structure further comprises a plurality of gate stacks surrounding portions of the plurality of nanosheet stacks exposed by the channel protecting liner, at least one asymmetric self-aligned gate isolation structure disposed over the channel protecting liner, and at least one symmetric self-aligned gate isolation structure disposed over a portion of the shallow trench isolation region between a third one of the plurality of fins and a fourth one of the plurality of fins.

In another embodiment, an integrated circuit comprises a nanosheet field-effect transistor structure comprising a substrate, a plurality of fins disposed over a top surface of the substrate, a shallow trench isolation region disposed over the top surface of the substrate surrounding the plurality of fins, and a plurality of nanosheet stacks of channel material disposed over the plurality of fins, the plurality of nanosheet stacks providing channels for one or more nanosheet field-effect transistors. The nanosheet field-effect transistor structure also comprises a channel protecting liner disposed over at least a portion of sidewalls and a top surface of a first one of the plurality of nanosheet stacks disposed over a first one of the plurality of fins, the channel protecting liner being further disposed over a portion of the shallow trench isolation region extending from the portion of the sidewalls of the first nanosheet stack toward a second one of the plurality of nanosheet stacks disposed over a second one of the plurality of fins. The nanosheet field-effect transistor structure further comprises a plurality of gate stacks surrounding portions of the plurality of nanosheet stacks exposed by the channel protecting liner, at least one asymmetric self-aligned gate isolation structure disposed over the channel protecting liner, and at least one symmetric self-aligned gate isolation structure disposed over a portion of the shallow trench isolation region between a third one of the plurality of fins and a fourth one of the plurality of fins.

BRIEF DESCRIPTION OF THE DRAWINGS

FIG. 1A depicts a top-down view of an aligned gate cut between two fins, according to an embodiment of the invention.

FIG. 1B depicts a top-down view of a mis-aligned and enlarged gate cut between two fins, according to an embodiment of the invention.

FIG. 4 depicts a side cross-sectional view of the FIG. 3A structure following formation of a channel protecting liner, a dummy gate and a gate hard mask, according to an embodiment of the invention.

FIG. 5B depicts a second side cross-sectional view of the FIG. 4 structure following the formation of source/drain regions and planarization, according to an embodiment of the invention.

FIG. 6 depicts a side cross-sectional view of the FIG. 5A structure following removal of the dummy gate, according to an embodiment of the invention.

FIG. 7 depicts a side cross-sectional view of the FIG. 6 structure following patterning of the channel protecting liner, according to an embodiment of the invention.

FIG. 8 depicts a side cross-sectional view of the FIG. 7 structure following selective growth of the sacrificial nanosheet material, according to an embodiment of the invention.

FIG. 9 depicts a side cross-sectional view of the FIG. 8 structure following formation of a self-aligned isolation layer, according to an embodiment of the invention.

FIG. 10 depicts a side cross-sectional view of the FIG. 9 structure following formation of an organic planarization layer, according to an embodiment of the invention.

FIG. 11 depicts a side cross-sectional view of the FIG. 10 structure following patterning of symmetric and asymmetric gate cuts, according to an embodiment of the invention.

FIG. 13 depicts a side cross-sectional view of the FIG. 12 structure following removal of the organic planarization layer and the sacrificial nanosheet material, according to an embodiment of the invention.

FIG. 14 depicts a side cross-sectional view of the FIG. 13 structure following formation of gate structures, according to an embodiment of the invention.

DETAILED DESCRIPTION

Figure 2:
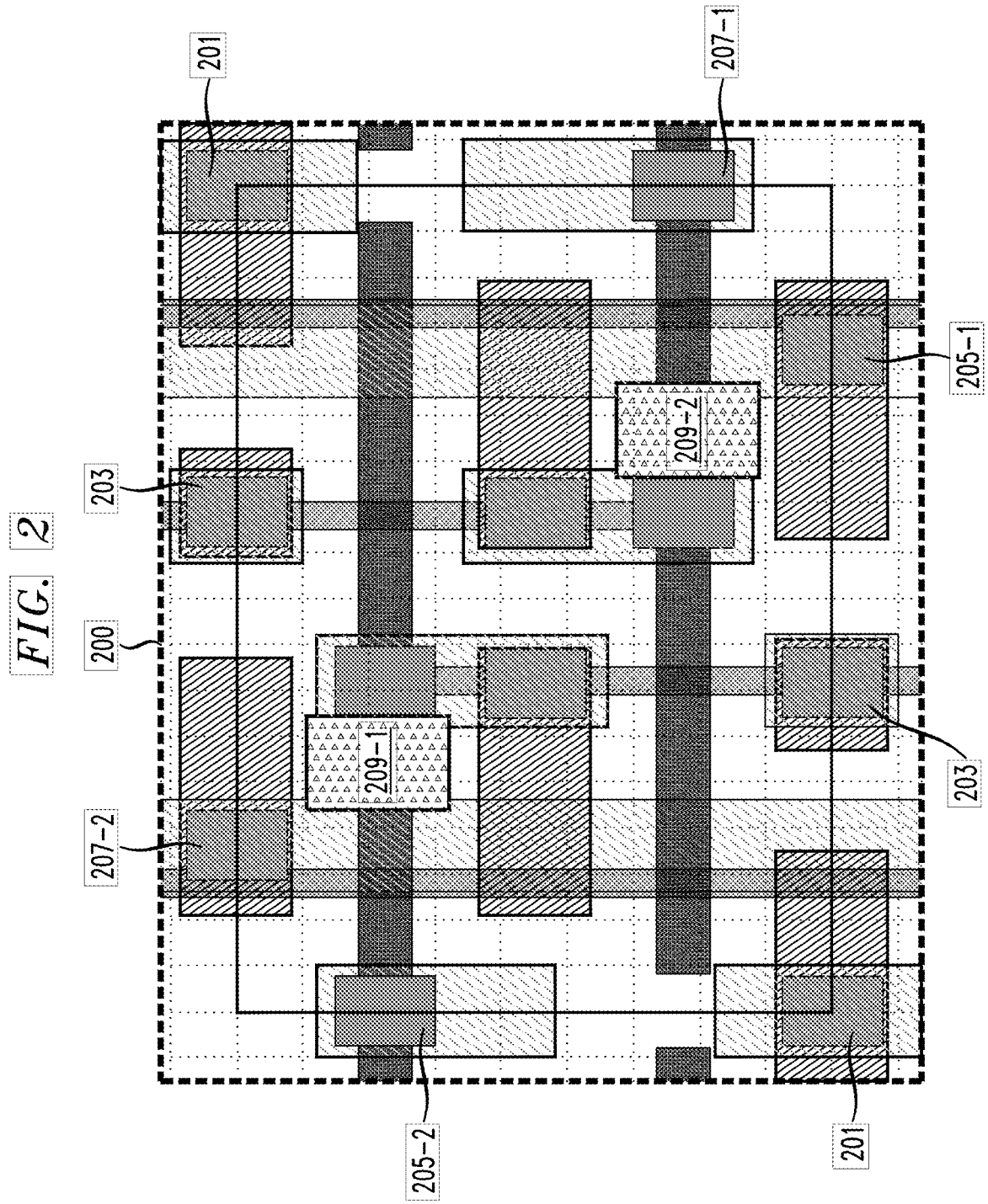
FIG. 2 depicts a top-down view of asymmetric gate cuts in a topology of a static random-access memory structure, according to an embodiment of the invention.

Illustrative embodiments of the invention may be described herein in the context of illustrative methods for performing self-aligned gate isolation with both symmetric and asymmetric cut placements. However, it is to be understood that embodiments of the invention are not limited to the illustrative methods, apparatus, systems and devices but instead are more broadly applicable to other suitable methods, apparatus, systems and devices.

A FET is a transistor having a source, a gate, and a drain, and having action that depends on the flow of majority carriers along a channel that runs past the gate between the source and drain. Current through the channel between the source and drain may be controlled by a transverse electric field under the gate. The length of the gate determines how fast the FET switches, and can be about the same as the length of the channel (such as the distance between the source and drain).

In some FETs, more than one gate or multi-gate arrangements may be used for controlling the channel. Multi-gate FETs are promising candidates to scale down complementary metal-oxide-semiconductor (CMOS) FET technology. However, the smaller dimensions associated with multi-gate FETs (as compared to single-gate FETs) necessitate greater control over performance issues such as short channel effects, punch-through, metal-oxide semiconductor (MOS) leakage current, and the parasitic resistance that is present in a multi-gate FET.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

As cell height scales, techniques for performing gate cuts do not meet the requirements, as the spacing between active regions is too small. A process referred to as self-aligned gate cut or self-aligned gate isolation may be used to scale active-to-active spacing to 5 nm and beyond. SAGE-induced gate cuts, however, are not ideal in certain situations that require the use of asymmetric gate cuts. Static random-access memory (SRAM) devices, for example, may utilize asymmetric gate cuts.

FIG. 1A depicts a top-down view 100 of an aligned gate cut 101 that is performed between two of a set of fins 102 on one of two gate structures 104. The aligned gate cut 101 represents an ideal case, where the gate cut 101 is perfectly aligned between the adjacent fins 104 and has a small critical dimension 103 (e.g., in the range of 6 to 15 nm). FIG. 1B depicts a top-down view 150 of a mis-aligned gate cut 110 that is performed between two of a set of fins 102 on one of two gate structures 104. As depicted, the gate cut 110 is not perfectly aligned, in that it is closer to one of the two adjacent fins 102 than the other. The mis-aligned gate cut 110 also has a larger critical dimension 130 (e.g., in the range of 15 to 40 nm).

For scaling to 5 nm and beyond, the cell height 105 of twice the gate cut 101 to fin 104 spacing plus the critical dimension 103 of the gate cut 101, with allowances for variations, is approximately 40 nm. The gate cut 101-to-fin 104 spacing should not pinch-off, with the required spacing being twice the thickness of the gate stack including a high-k gate dielectric and work function metal (WFM) gate conductor (e.g., 2×(2+5)=14 nm). Further, fin critical dimension uniformity (CDU), fin pitch walking (PW), gate cut CDU, and gate cut overlay parameters, which are assumed to be controlled tightly, have a total variation of only 5 nm. The CD of the gate cut 101 should therefore be approximately 40 nm−(2×14 nm)−5 nm=7 nm, which is not achievable using conventional lithography processing.

As noted above, self-aligned gate cut or self-aligned gate isolation techniques may be used for future cell height scaling. A self-aligned gate cut processing flow may include fin patterning (e.g., of fins and other layers including a passivation layer, a poly-silicon layer and a hard mask layer). Next, a liner dielectric may be formed, followed by a shallow trench isolation (STI) region. The STI region may then be recessed (e.g., a fin reveal is performed), followed by formation of a dummy gate dielectric. A spacer (e.g., of poly-silicon) is then formed, which is either merged or discrete depending on fin spacing. An isolation plug is then formed. The dummy gate is then patterned using a gate hard mask and techniques such as self-aligned double patterning (SADP). An anisotropic etch is then performed, where the anisotropic etch is selective to the isolation plug, the dummy gate dielectric and the gate hard mask. In this way, symmetric gate cuts may be performed.

Self-aligned gate cut processing, however, is not suitable for forming asymmetric gate cuts needed in some application scenarios. For example, as noted above, SRAM structures may utilize asymmetric gate cuts. SRAM is a type of memory device that offers high speed, low power consumption and simple operation. Unlike dynamic random-access memory (DRAM), SRAM does not need to regularly refresh stored data and has a straightforward design. SRAM cells may be formed using varying numbers of transistors.

The six transistor (6T) SRAM cell is widely used as a primary memory in microprocessor circuits. A 6T SRAM cell may include a first n-type FET device (nFET) connected to a first bit line node (BL), a first output node (Q), and a word line node (WL). A second nFET device of the 6T SRAM cell is connected to the Q node, a ground node (e.g., VSS), and a second output node (Q'). A first p-type FET device (pFET) is connected to the Q node, the Q' node, and a voltage source or supply node (e.g., VDD). A second pFET device is connected to the VDD node, the Q node and the Q' node. A third nFET device is connected to the VSS node, the Q node, and the Q' node. A fourth nFET device is connected to a second bit line node (BLB), the WL node and the Q' node. The first and fourth nFET devices are pass-gate (PG) transistors of the 6T SRAM cell, the second and third nFET devices are the pull-down (PD) transistors of the 6T SRAM cell, and the first and second pFET devices are the pull-up (PU) transistors of the 6T SRAM cell.

FIG. 2 depicts a top-down view 200 of asymmetric gate cuts 209-1 and 209-2 for an SRAM cell. In the top-down view 200, element 201 shows VSS (e.g., a 0 volt (V) or "ground" voltage) connections while element 203 shows VDD (e.g., a positive supply voltage) connections. Elements 205-1 and 205-2 show WL connections of the SRAM cell, and elements 207-1 and 207-2 show bitline connections (e.g., BL and BLB, respectively) of the SRAM cell. Elements 209-1 and 209-2 illustrate the asymmetric gate cuts, which are disposed closer to one of two adjacent fins, rather than being formed symmetrically between two adjacent fins.

An illustrative process for performing self-aligned gate isolation with both symmetric and asymmetric cut placements will now be described in further detail with respect to FIGS. 3-14.

Figure 3A:
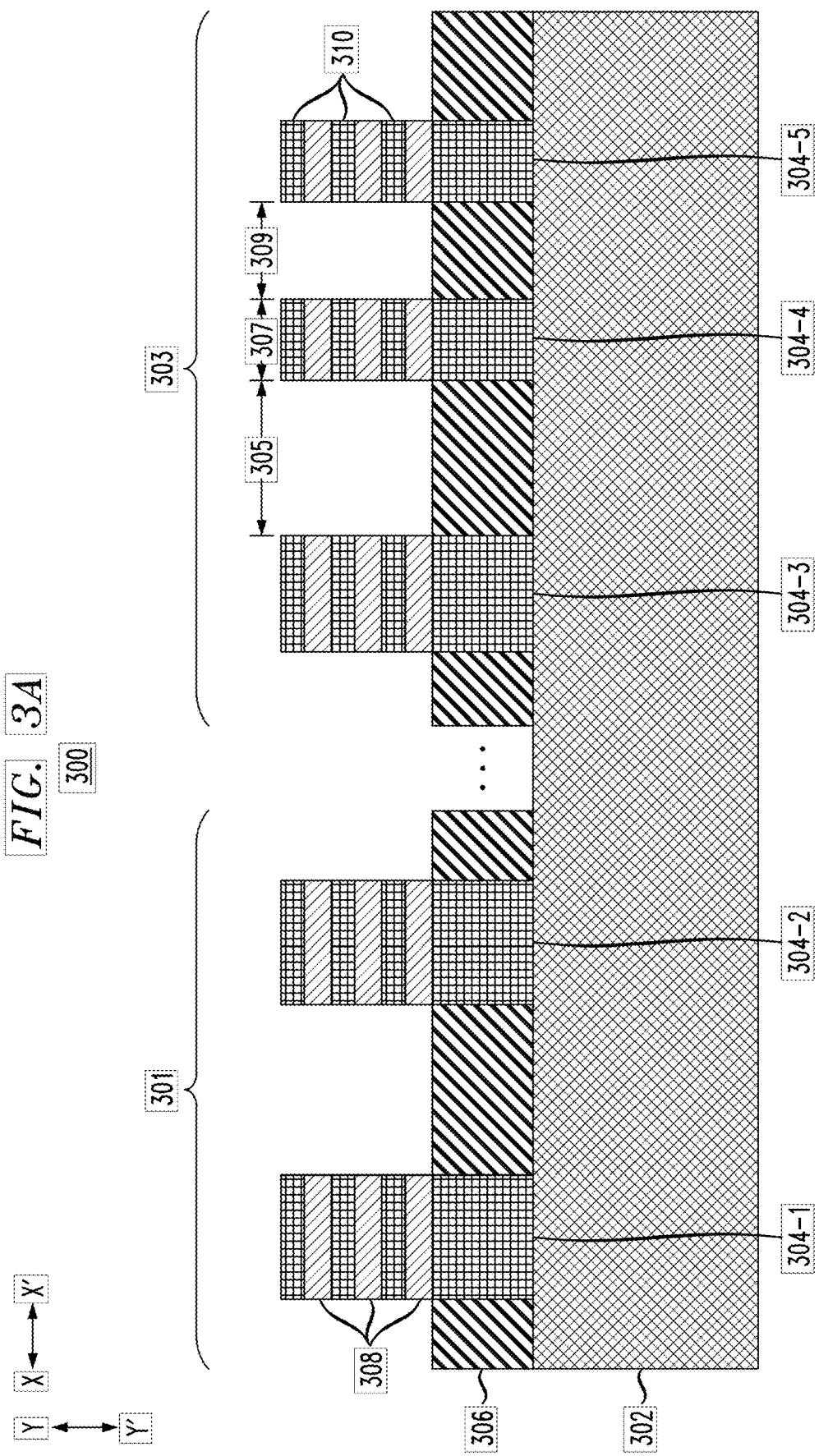
FIG. 3A depicts a side cross-sectional view of a semiconductor structure after patterning of nanosheet stacks, according to an embodiment of the invention.

FIG. 3A shows a side cross-sectional view 300 of a semiconductor structure after patterning of nanosheet stacks over a substrate 302. A set of fins 304-1 through 304-5 (collectively, fins 304) are formed over the substrate 302. The set of fins 304 are surrounded by STI region 306. Nanosheet stacks including alternating layers 308 and 310 of a sacrificial material and a channel material are formed over each of the fins 304. While FIG. 3A shows an example where there are three sacrificial layers 308 and three channel layers 310 in each nanosheet stack, it should be appreciated that this is merely an example, and that nanosheet stacks may include more or fewer than three sets of alternating layers of the sacrificial material and the channel material.

The substrate 302 may be a semiconductor structure formed of bulk silicon (Si), although other suitable materials may be used, such as various silicon-containing materials. Illustrative examples of silicon-containing materials suitable for the substrate 302 include, but are not limited to, Si, silicon germanium (SiGe), silicon germanium carbide (SiGeC), silicon carbide (SiC), polysilicon, epitaxial silicon, amorphous silicon, and multi-layers thereof. Although silicon is the predominantly used semiconductor material in wafer fabrication, alternative semiconductor materials can be employed, such as, but not limited to, germanium (Ge), gallium arsenide (GaAs), gallium nitride (GaN), cadmium telluride (CdTe) and zinc selenide (ZnSe). In an alternate embodiment, the substrate 302 may be silicon-on-insulator (SOI) wafer. As is known in the art, a SOI wafer includes a SOI layer separated from a substrate by a buried insulator. Suitable substrate materials include, but are not limited to, Si, strained Si, silicon carbide (SiC), Ge, SiGe, SiGeC, Si alloys, Ge alloys, GaAs, indium arsenide (InAs), indium phosphide (InP), or any combination thereof. Suitable dielectric materials for the buried insulator include, but are not limited to, an oxide material such as silicon dioxide ($SiO_2$). When the buried insulator is an oxide, the buried insulator may also be referred to as a buried oxide or BOX.

The substrate 302 may have a width or horizontal thickness (in direction X-X') that varies as desired (e.g., based on the number of fins 304 or other device structures to be formed). The substrate 302 may have a height or vertical thickness (in direction Y-Y') ranging from 300 micrometers (μm) to 1000 μm.

The fins 304 may be formed of the same material as the underlying substrate 302. For example, in some embodiments the fins 304 are formed from a bulk substrate using lithography and etching (e.g., reactive-ion etching (RIE)). Other suitable techniques, such as sidewall image transfer (SIT), self-aligned double patterning (SADP), self-aligned multiple patterning (SAMP), self-aligned quadruple patterning (SAQP), etc. can be used to form the fins 304. In such cases, the fins 304 may be formed of the same material as the substrate 302 (e.g., Si). Alternatively, the fins 304 may be formed of a different material than the substrate 302 by first epitaxially growing a different material on the substrate 302, and then patterning to form the fins 304. For example, the fins 304 can be silicon germanium (SiGe) while the substrate 302 can be Si.

Each of the fins 304 may have a vertical thickness or height (in direction Y-Y') in the range of 20 to 35 nm and a horizontal thickness or width (in direction X-X') that varies in the range of 6 to 100 nm. As shown in FIG. 3A, different ones of the fins 304 have different widths (e.g., fins 304-1, 304-2 and 304-3 are larger in direction X-X' than fins 304-4 and 304-5). The spacing between the fins 304 may also vary as will be described in further detail below.

The STI layer 306 may be formed of a dielectric material such as silicon oxide ($SiO_x$), silicon nitride (SiN), silicon oxycarbide (SiOC), silicon oxynitride (SiON), or any other suitable dielectric material. The vertical thickness or height (in direction Y-Y') of the STI layer 306 is defined by fin reveal processing, and will approximately match the level of the bottom surface of the nanosheet stack. The horizontal thickness or width (in direction X-X') of the STI layer 306 is defined by the spacing between the fins 304 as shown.

The nanosheet stack, as noted above, includes alternating layers of a sacrificial material 308 and a channel material 310. The sacrificial layers 308 may be formed of any suitable material that may be etched selective to the channel material 310. If the channel material 310 is Si, the sacrificial layers 308 may be SiGe. If the channel material 310 is indium gallium arsenide (InGaAs), the sacrificial layers 308 may be indium aluminum arsenide (InAlAs). Various other combinations of III-V materials may be used. The material of the sacrificial layers 308 is one that can be removed selective to the material of the channel layers 310. The sacrificial layers 308 and channel layers 310 may each have a thickness in the range of 4 nm to 15 nm. The nanosheet stack of sacrificial layers 308 and channel layers 310 may be epitaxially grown over the fins 304.

FIG. 3A shows two regions, denoted 301 and 303, of nanosheet stacks formed over a common substrate 302. The region 301 is referred to herein as a "logic" region, and the fins 304-1 and 304-2 may provide for nFET or pFET devices as desired for logic devices of a resulting structure. The region 303 is referred to herein as an "SRAM" region, where the fins 304-3, 304-4 and 304-5 provide nFET and pFET devices for forming SRAM cells (e.g., such as that shown in the top-down view 200 of FIG. 2). In some embodiments, the fin 304-3 provides for nFET devices while the fins 304-4 and 304-5 provide for pFET devices. The spacing between the fin 304-3 providing the nFET device and the fin 304-4 providing the pFET device, denoted in FIG. 3A as element 305, may be approximately 40 nm. The width of the fin 304-4, denoted in FIG. 3A as element 307, may be approximately 15 nm. The spacing between the fins 304-4 and 304-5 providing pFET devices, denoted in FIG. 3A as element 309, may be approximately 30 nm.

Figure 3B:
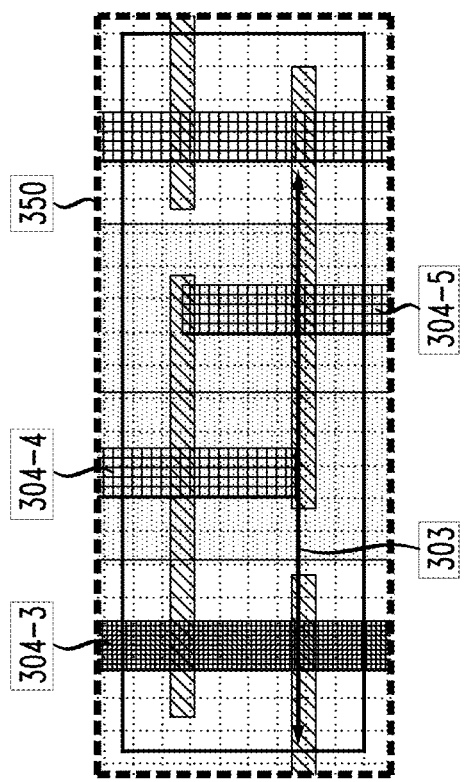
FIG. 3B depicts a top-down view of a portion of the FIG. 3A structure, according to an embodiment of the invention.

FIG. 3B shows a top-down view 350 of the region 303 of a resulting SRAM cell formed from the structure shown in the side cross-sectional view 300 of FIG. 3A. The side cross-sectional view 300 of FIG. 3A (as well as the side cross-sectional views of FIGS. 4, 5A and 6-14) is taken across or perpendicular to the fins 304.

FIG. 4 shows a side cross-sectional view 400 of the FIG. 3A structure following formation of a channel protecting liner 312, a dummy gate 314, and a gate hard mask 316. The channel protecting liner 312, as shown, is formed over the STI region 306 and surrounding the nanosheet stacks. The channel protecting liner 312, which may also be referred to as a dummy gate oxide layer 312, may have a uniform thickness in the range of 2 to 5 nm. The channel protecting liner 312 may be formed using atomic layer deposition (ALD) or other suitable techniques. The channel protecting liner 312 may be formed of an oxide such as silicon dioxide ($SiO_2$).

The dummy gate 314 is formed over the channel protecting liner 312, filling the spaces between the nanosheets stacks and overfilling the structure. The dummy gate 314 may have a height or vertical thickness (in direction Y-Y'), as measured from the channel protecting liner 312 formed over the STI region 306, in the range of 60 to 200 nm. The dummy gate 314 may be formed of amorphous silicon (a-Si) or another suitable material such as amorphous silicon germanium (a-SiGe), poly-silicon (poly-Si) poly-silicon germanium (poly-SiGe), etc. The dummy gate 314 may be formed using ALD, chemical vapor deposition (CVD), physical vapor deposition (PVD) or other suitable processing.

The gate hard mask 316 is patterned over the top of the dummy gate 314 (e.g., in regions where gates for the resulting structures will be formed). The gate hard mask 316 may be formed using CVD, PVD or other suitable processing. The gate hard mask 316 may be formed of $SiO_2$, SiN, combinations thereof, etc. The gate hard mask 316 may have a height or vertical thickness (in direction Y-Y') in the range of 20 to 120 nm.

Figure 5A:
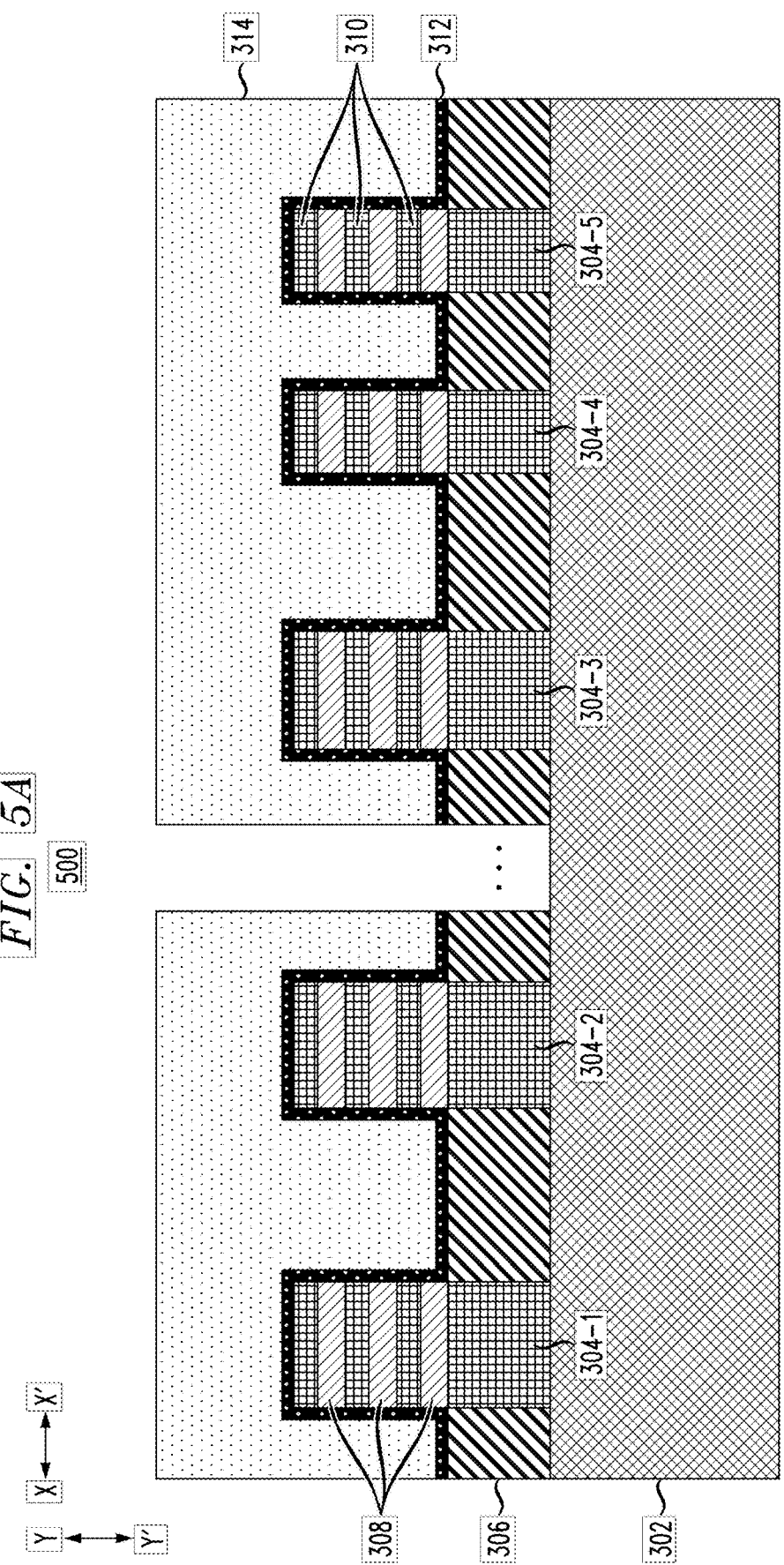
FIG. 5A depicts a first side cross-sectional view of the FIG. 4 structure following formation of source/drain regions and planarization, according to an embodiment of the invention.

FIG. 5A shows a first side cross-sectional view 500 of the FIG. 4 structure, following formation of source/drain regions 318 and planarization. FIG. 5B shows a second side cross-sectional view 550 of the FIG. 4 structure following formation of the source/drain regions 318. FIG. 5B also shows a first spacer 320 formed between the sacrificial layers 308 and the source/drain regions 318 and a second spacer 322 formed between the dummy gate 314 and an interlayer dielectric (ILD) 316. As noted above, the side cross-sectional view 500 of FIG. 5A is taken across or perpendicular to the fins 304. The side cross-sectional view 550 of FIG. 5B is taken along or parallel to one of the fins 304.

The source/drain regions 318 may be formed using an epitaxial growth process. In some embodiments, the epitaxial growth process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus (P), arsenic (As), antimony (Sb), etc.) or p-type dopants (e.g., boron (B), boron fluoride ($BF_2$), gallium (Ga), indium (In), thallium (Tl), etc.), depending on the type of transistor. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The spacer 322 may be formed by depositing a conformal spacer liner, followed by anisotropic spacer RIE. The spacer 320 may be formed by recessing the nanosheet stack, followed by forming selective indentation of the sacrificial layers 308 of the nanosheet stack (e.g., where the sacrificial layers 308 may be formed of SiGe and the channel layers 310 may be formed of Si as noted above). The spacer material for spacer 320 may then be filled in the indents with a conformal spacer liner, with the spacer liner being removed elsewhere using an isotropic etching process. The spacer 320 and spacer 322 may each be formed of SiN, silicon oxycarbonitride (SiOCN), silicon oxycarbide (SiOC), SiC, silicon boron carbide nitride (SiBCN), etc.

FIG. 6 shows a side cross-sectional view 600 of the FIG. 5A structure following removal of the dummy gate 314. The dummy gate 314 may be removed using a selective wet or dry etch process, such as a hot ammonia clean. Removal of the dummy gate 314 exposes the channel protecting liner 312.

FIG. 7 shows a side cross-sectional view 700 of the FIG. 6 structure following patterning of the channel protecting liner 312 using a dummy oxide mask layer 324. The dummy oxide mask layer 324 is patterned over a portion of the fin 304-4 that faces fin 304-3 (e.g., for an SRAM device, the dummy oxide mask layer 324 protects the SRAM pFET side that faces the nFET provided using fin 304-3). The dummy oxide mask layer 324 may be formed and patterned using lithography and etching or other suitable techniques.

The dummy oxide mask layer 324 may be formed of an organic planarization layer (OPL) material such as polyacrylate resin, epoxy resin, phenol resin, polyamide resin, polyimide resin, unsaturated polyester resin, polyphenylenether resin, polyphenylenesulfide resin, benzocyclobutene (BCB), etc. The dummy oxide mask layer 324 may be formed using spin-on coating or other suitable processing. The dummy oxide mask layer 324 may have a height or vertical thickness (in direction Y-Y'), as measured from a top of the channel protecting liner 312 formed over the STI region 306, in the range of 60 to 200 nm. The width or horizontal thickness (in direction X-X') of the EG mask layer 324 may vary, such as based on the width of the fin 304-4 and the spacing between the fins 304-3 and 304-4. As shown in FIG. 7, the dummy oxide mask layer 324 extends from a middle of a top of the nanosheet stack over fin 304-4 to a middle of the STI region 306 between the fins 304-3 and 304-4.

After the dummy oxide mask layer 324 is patterned, the channel protecting liner 312 exposed by the patterned dummy oxide mask layer 324 is removed, such as using an isotropic oxide dry etch process.

FIG. 8 shows a side cross-sectional view 800 of the FIG. 7 structure, following removal of the patterned dummy oxide mask layer 324 (e.g., using ashing) and following selective epitaxial growth 326 of the material (e.g., SiGe) of the sacrificial layers 308 of the nanosheet stacks. As shown, the material 326 is grown over exposed surfaces of the nanosheet stacks not covered by the remaining channel protecting liner 312. The epitaxial growth of material 326 may have a uniform thickness in the range of 5 to 30 nm.

FIG. 9 shows a side cross-sectional view 900 of the FIG. 8 structure following formation of a self-aligned isolation layer 328. The self-aligned isolation layer 328 may be formed of a dielectric material such as $SiO_2$, SiN, SiOCN, SiOC, SiC, SiBCN, etc. The self-aligned isolation layer 328 may be formed by depositing the dielectric material into the gaps, followed by etching back to the level of the top surface of material 326 that is revealed as described above. The isolation layer 328 is self-aligned as it fills the gaps between the material 326 over the STI region 306 and the remaining channel protecting liner 312.

FIG. 10 shows a side cross-sectional view 1000 of the FIG. 9 structure following formation of an OPL 330 over the top of the self-aligned isolation layer 328 and the material 326. The OPL 330 may be formed using spin-on coating, using materials similar to that described above with respect to the dummy oxide mask layer 324. The OPL 330 may have a height or vertical thickness (in direction Y-Y') in the range of 20 to 100 nm.

FIG. 11 shows a side cross-sectional view 1100 of the FIG. 10 structure following patterning of gate cuts in the OPL 330. More particularly, FIG. 11 shows a symmetric gate cut 1101 formed in the OPL 330 in the logic region 301, and an asymmetric gate cut 1103 formed in the OPL 330 in the SRAM region 303. The symmetric gate cut 1101 and the asymmetric gate cut 1103 may be formed by patterning a mask over the OPL 330 and etching the exposed portion of the OPL 330 to reveal portions of the underlying self-aligned isolation layer 328. The symmetric gate cut 1101 and asymmetric gate cut 1103 may be defined using lithography. The asymmetric gate cut 1103 exposes portions of the self-aligned isolation layer 328. The isolation layer 328 is self-aligned, and thus the asymmetric gate cut 1103 may therefore be viewed as self-aligned. As noted elsewhere herein, the asymmetric gate cut 1103 in some embodiments may be formed between fin 304-3 providing an SRAM nFET device and fin 304-4 providing an SRAM pFET device. The portion of the self-aligned isolation layer 328 exposed by the asymmetric gate cut 1103 is close to the nanosheet stack above fin 304-4, and thus the asymmetric gate cut 1103 may be referred to as a self-aligned asymmetric gate cut.

The symmetric gate cut 1101 exposes the self-aligned isolation layer 328 that is formed between the fins 304-1 and 304-2 in the logic region 301. The symmetric gate cut 1101 may have a width or horizontal thickness (in direction X-X') in the range of 15 to 35 nm.

The asymmetric gate cut 1103 exposes at least a portion of the self-aligned isolation layer 328 that is formed over the remaining channel protecting liner 312 as illustrated. The asymmetric gate cut 1103 may have a width or horizontal thickness (in direction X-X') in the range of 15 to 35 nm.

Figure 12:
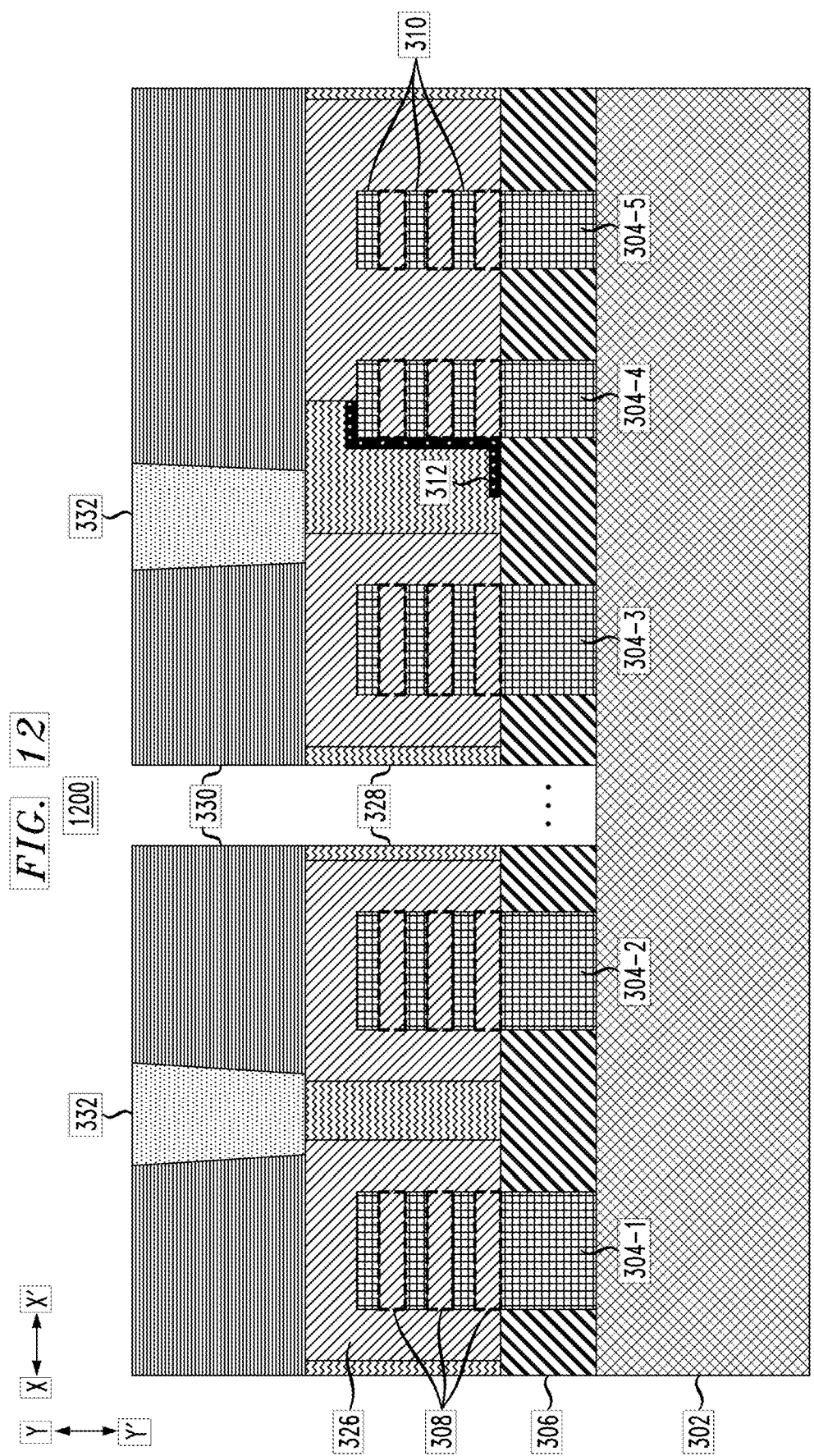
FIG. 12 depicts a side cross-sectional view of the FIG. 11 structure following fill of the symmetric and asymmetric gate cuts with a dielectric material, according to an embodiment of the invention.

FIG. 12 shows a side cross-sectional view 1200 of the FIG. 11 structure following fill of the symmetric gate cut 1101 and the asymmetric gate cut 1103 with a dielectric material 332. The dielectric material 332 may comprise SiN, SiCO, SiC or another suitable material.

FIG. 13 shows a side cross-sectional view 1300 of the FIG. 12 structure following removal of the OPL 330 and the sacrificial material (e.g., sacrificial nanosheets 308 and material 326). The OPL 330 may be removed using ashing. The sacrificial material (e.g., 308 and 326) is removed using a selective etch.

FIG. 14 shows a side cross-sectional view 1400 of the FIG. 13 structure following formation of gate structures 334 (e.g., using a replacement metal gate (RMG) process). The gate structures 334 may include a gate dielectric layer that is conformally deposited followed by formation of a gate conductor layer.

The gate dielectric layer may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 4 nm.

The gate conductor layer may include a metal gate or work function metal (WFM). In some embodiments, the gate conductor layer is formed using atomic layer deposition (ALD) or another suitable process. For nFET devices, the WFM for the gate conductor layer may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layer as desired.

The processing described above with respect to FIGS. 3-14 advantageously enables the formation of a structure (e.g., an integrated circuit) with both symmetric and asymmetric self-aligned gate isolations. For the gate cut region, an additional gate cut structure is formed over the self-aligned gate isolations. For asymmetric self-aligned gate isolations, some top portion of the isolation structure is formed over the top of a nanosheet stack.

The process for forming the self-aligned gate isolation includes forming a channel protecting liner (e.g., the dummy oxide layer 312), and using a mask (e.g., the dummy oxide mask 322) to protect at least some of the channel protecting liner and removing the unprotected liner to expose the channel of the nanosheet stacks. A sacrificial liner (e.g., material 326) is formed over the exposed channel of the nanosheet stacks, followed by formation of self-aligned gate isolation (e.g., self-aligned gate isolation layer 328). A sacrificial material (e.g., OPL 330) is formed over the self-aligned gate isolation and the sacrificial liner, followed by formation of gate cuts (e.g., symmetric gate cut 1101 and asymmetric gate cut 1103) into the sacrificial material. The sacrificial material and sacrificial liner are then removed, followed by RMG processing to form the gate structures.

In some embodiments, a method of forming a semiconductor structure comprises forming a plurality of fins over a top surface of a substrate, forming an STI region over the top surface of the substrate surrounding the plurality of fins, and forming a plurality of nanosheet stacks of channel material over the plurality of fins, the plurality of nanosheet stacks providing channels for one or more nanosheet FETs. The method also comprises forming a channel protecting liner over at least a portion of sidewalls and a top surface of a first one of the plurality of nanosheet stacks formed over a first one of the plurality of fins, the channel protecting liner being further formed over a portion of the STI region extending from the portion of the sidewalls of the first nanosheet stack toward a second one of the plurality of nanosheet stacks formed over a second one of the plurality of fins. The method further comprises forming a plurality of gate stacks surrounding portions of the plurality of nanosheet stacks exposed by the channel protecting liner, forming at least one asymmetric self-aligned gate isolation structure over the channel protecting liner, and forming at least one symmetric self-aligned gate isolation structure over a portion of the STI region between a third one of the plurality of fins and a fourth one of the plurality of fins.

The asymmetric self-aligned gate isolation structure formed over the channel protecting liner may comprise a first portion formed adjacent the channel protecting liner surrounding sidewalls of the first nanosheet stack and a second portion formed over a top surface of the channel protecting liner surrounding the portion of the top surface of the first nanosheet stack.

The first nanosheet stack and the second nanosheet stack provide nanosheet channels for nanosheet FETs of at least one SRAM device structure. The first nanosheet stack may provide nanosheet channels for a pFET and the second nanosheet stack provides nanosheet channels for an nFET. A third one of the plurality of nanosheet stacks formed over the third fin and a fourth one of the plurality of nanosheet stacks formed over the fourth fin may provide nanosheet channels for nanosheet FETs of one or more logic device structures.

Forming the channel protecting liner may comprise forming the channel protecting liner surrounding the plurality of nanosheet stacks and over the STI region between the plurality of fins, forming a dummy gate structure over the channel protecting liner, patterning a gate hard mask over the dummy gate structure, and removing portions of the dummy gate structure exposed by the patterned gate hard mask. Forming the channel protecting liner may further comprise forming source/drain regions in spaces formed by removal of the dummy gate structure, and removing remaining portions of the dummy gate structure. Forming the channel protecting liner may further comprise patterning a mask layer over portions of the channel protecting liner surrounding the portion of the sidewalls and the top surface of the first nanosheet stack and the portion of the STI region extending from the portion of the sidewalls of the first nanosheet toward the second nanosheet stack, and removing portions of the channel protecting liner exposed by the patterned mask layer.

Forming the plurality of nanosheet stacks may comprise forming alternating layers of a sacrificial material and the channel material, and the method may further comprise selectively growing additional sacrificial material over portions of the plurality of nanosheet stacks exposed by the channel protecting liner. Forming the asymmetric self-aligned gate isolation structure and the symmetric self-aligned gate structure may comprise forming an isolation material over the structure surrounding the additional sacrificial material. Forming the asymmetric self-aligned gate isolation structure and the symmetric self-aligned gate structure may further comprise forming an OPL over the isolation material and the additional sacrificial material. Forming the asymmetric self-aligned gate isolation structure and the symmetric self-aligned gate structure may further comprise patterning the OPL to expose (i) at least a portion of the isolation material formed over the channel protecting liner for the asymmetric self-aligned gate isolation structure and (ii) at least a portion of the isolation material formed over the STI region between the third and fourth nanosheet stacks for the symmetric self-aligned gate isolation structure. Forming the asymmetric self-aligned gate isolation structure and the symmetric self-aligned gate structure may further comprise filling additional isolation material in regions exposed by patterning the OPL.

Forming the plurality of gate stacks comprises removing the OPL, the sacrificial material of the nanosheet channel stacks, and the additional sacrificial material. Forming the plurality of gate stacks may further comprise forming a gate dielectric and a gate conductor in the spaces formed by removal of the OPL, the sacrificial material of the nanosheet channel stacks, and the additional sacrificial material.

In some embodiments, a semiconductor structure comprises a substrate, a plurality of fins disposed over a top surface of the substrate, an STI region disposed over the top surface of the substrate surrounding the plurality of fins, and a plurality of nanosheet stacks of channel material disposed over the plurality of fins, the plurality of nanosheet stacks providing channels for one or more nanosheet FETs. The semiconductor structure also comprises a channel protecting liner disposed over at least a portion of sidewalls and a top surface of a first one of the plurality of nanosheet stacks disposed over a first one of the plurality of fins, the channel protecting liner being further disposed over a portion of the STI region extending from the portion of the sidewalls of the first nanosheet stack toward a second one of the plurality of nanosheet stacks disposed over a second one of the plurality of fins. The semiconductor structure further comprises a plurality of gate stacks surrounding portions of the plurality of nanosheet stacks exposed by the channel protecting liner, at least one asymmetric self-aligned gate isolation structure disposed over the channel protecting liner, and at least one symmetric self-aligned gate isolation structure disposed over a portion of the STI region between a third one of the plurality of fins and a fourth one of the plurality of fins.

The asymmetric self-aligned gate isolation structure disposed over the channel protecting liner may comprise a first portion disposed adjacent the channel protecting liner surrounding sidewalls of the first nanosheet stack and a second portion disposed over a top surface of the channel protecting liner surrounding the portion of the top surface of the first nanosheet stack.

The first nanosheet stack and the second nanosheet stack may provide nanosheet channels for nanosheet FETs of at least one SRAM device structure. The first nanosheet stack may provide nanosheet channels for a pFET and the second nanosheet stack provides nanosheet channels for an nFET. A third one of the plurality of nanosheet stacks disposed over the third fin and a fourth one of the plurality of nanosheet stacks disposed over the fourth fin may provide nanosheet channels for nanosheet FETs of one or more logic device structures.

In some embodiments, integrated circuits comprise nanosheet FET structures comprising the above-described semiconductor structures.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure comprising:
   forming a plurality of fins over a top surface of a substrate;
   forming a shallow trench isolation region over the top surface of the substrate surrounding the plurality of fins;
   forming a plurality of nanosheet stacks of channel material over the plurality of fins, the plurality of nanosheet stacks providing channels for one or more nanosheet field-effect transistors;
   forming a channel protecting liner over at least a portion of sidewalls and a top surface of a first one of the plurality of nanosheet stacks formed over a first one of the plurality of fins, the channel protecting liner being further formed over a portion of the shallow trench isolation region extending from the portion of the sidewalls of the first nanosheet stack toward a second one of the plurality of nanosheet stacks formed over a second one of the plurality of fins;
   forming a plurality of gate stacks surrounding portions of the plurality of nanosheet stacks exposed by the channel protecting liner;
   forming at least one asymmetric self-aligned gate isolation structure over the channel protecting liner; and
   forming at least one symmetric self-aligned gate isolation structure over a portion of the shallow trench isolation region between a third one of the plurality of fins and a fourth one of the plurality of fins.

2. The method of claim 1, wherein the asymmetric self-aligned gate isolation structure formed over the channel protecting liner comprises:

a first portion formed adjacent the channel protecting liner surrounding sidewalls of the first nanosheet stack; and a second portion formed over a top surface of the channel protecting liner surrounding the portion of the top surface of the first nanosheet stack.

3. The method of claim 1, wherein the first nanosheet stack and the second nanosheet stack provide nanosheet channels for nanosheet field-effect transistors of at least one static random-access memory device structure.

4. The method of claim 3, wherein the first nanosheet stack provides nanosheet channels for a p-type nanosheet field-effect transistor and the second nanosheet stack provides nanosheet channels for an n-type nanosheet field-effect transistor.

5. The method of claim 3, wherein a third one of the plurality of nanosheet stacks formed over the third fin and a fourth one of the plurality of nanosheet stacks formed over the fourth fin provide nanosheet channels for nanosheet field-effect transistors of one or more logic device structures.

6. The method of claim 1, wherein forming the channel protecting liner comprises:
    forming the channel protecting liner surrounding the plurality of nanosheet stacks and over the shallow trench isolation region between the plurality of fins;
    forming a dummy gate structure over the channel protecting liner;
    patterning a gate hard mask over the dummy gate structure; and
    removing portions of the dummy gate structure exposed by the patterned gate hard mask.

7. The method of claim 6, wherein forming the channel protecting liner further comprises:
    forming source/drain regions in spaces formed by removal of the dummy gate structure; and
    removing remaining portions of the dummy gate structure.

8. The method of claim 7, wherein forming the channel protecting liner further comprises:
    patterning a mask layer over portions of the channel protecting liner surrounding the portion of the sidewalls and the top surface of the first nanosheet stack and the portion of the shallow trench isolation region extending from the portion of the sidewalls of the first nanosheet toward the second nanosheet stack; and
    removing portions of the channel protecting liner exposed by the patterned mask layer.

9. The method of claim 8, wherein forming the plurality of nanosheet stacks comprises forming alternating layers of a sacrificial material and the channel material, and further comprising selectively growing additional sacrificial material over portions of the plurality of nanosheet stacks exposed by the channel protecting liner.

10. The method of claim 9, wherein forming the asymmetric self-aligned gate isolation structure and the symmetric self-aligned gate structure comprises forming an isolation material over the structure surrounding the additional sacrificial material.

11. The method of claim 10, wherein forming the asymmetric self-aligned gate isolation structure and the symmetric self-aligned gate structure further comprises forming an organic planarization layer over the isolation material and the additional sacrificial material.

12. The method of claim 11, wherein forming the asymmetric self-aligned gate isolation structure and the symmetric self-aligned gate structure further comprises patterning the organic planarization layer to expose (i) at least a portion of the isolation material formed over the channel protecting liner for the asymmetric self-aligned gate isolation structure and (ii) at least a portion of the isolation material formed over the shallow trench isolation region between the third and fourth nanosheet stacks for the symmetric self-aligned gate isolation structure.

13. The method of claim 12, wherein forming the asymmetric self-aligned gate isolation structure and the symmetric self-aligned gate structure further comprises filling additional isolation material in regions exposed by patterning the organic planarization layer.

14. The method of claim 13, wherein forming the plurality of gate stacks comprises removing the organic planarization layer, the sacrificial material of the nanosheet channel stacks, and the additional sacrificial material.

15. The method of claim 13, wherein forming the plurality of gate stacks further comprises forming a gate dielectric and a gate conductor in the spaces formed by removal of the organic planarization layer, the sacrificial material of the nanosheet channel stacks, and the additional sacrificial material.

16. A semiconductor structure comprising:
    a substrate;
    a plurality of fins disposed over a top surface of the substrate;
    a shallow trench isolation region disposed over the top surface of the substrate surrounding the plurality of fins;
    a plurality of nanosheet stacks of channel material disposed over the plurality of fins, the plurality of nanosheet stacks providing channels for one or more nanosheet field-effect transistors;
    a channel protecting liner disposed over at least a portion of sidewalls and a top surface of a first one of the plurality of nanosheet stacks disposed over a first one of the plurality of fins, the channel protecting liner being further disposed over a portion of the shallow trench isolation region extending from the portion of the sidewalls of the first nanosheet stack toward a second one of the plurality of nanosheet stacks disposed over a second one of the plurality of fins;
    a plurality of gate stacks surrounding portions of the plurality of nanosheet stacks exposed by the channel protecting liner;
    at least one asymmetric self-aligned gate isolation structure disposed over the channel protecting liner; and
    at least one symmetric self-aligned gate isolation structure disposed over a portion of the shallow trench isolation region between a third one of the plurality of fins and a fourth one of the plurality of fins.

17. The semiconductor structure of claim 16, wherein the asymmetric self-aligned gate isolation structure disposed over the channel protecting liner comprises:
    a first portion disposed adjacent the channel protecting liner surrounding sidewalls of the first nanosheet stack; and
    a second portion disposed over a top surface of the channel protecting liner surrounding the portion of the top surface of the first nanosheet stack.

18. The semiconductor structure of claim 16, wherein the first nanosheet stack and the second nanosheet stack provide nanosheet channels for nanosheet field-effect transistors of at least one static random-access memory device structure.

19. The semiconductor structure of claim 18, wherein the first nanosheet stack provides nanosheet channels for a p-type nanosheet field-effect transistor and the second nanosheet stack provides nanosheet channels for an n-type nanosheet field-effect transistor.

20. The semiconductor structure of claim 18, wherein a third one of the plurality of nanosheet stacks disposed over the third fin and a fourth one of the plurality of nanosheet stacks disposed over the fourth fin provide nanosheet channels for nanosheet field-effect transistors of one or more logic device structures.

21. An integrated circuit comprising:
a nanosheet field-effect transistor structure comprising:
   a substrate;
   a plurality of fins disposed over a top surface of the substrate;
   a shallow trench isolation region disposed over the top surface of the substrate surrounding the plurality of fins;
   a plurality of nanosheet stacks of channel material disposed over the plurality of fins, the plurality of nanosheet stacks providing channels for one or more nanosheet field-effect transistors;
   a channel protecting liner disposed over at least a portion of sidewalls and a top surface of a first one of the plurality of nanosheet stacks disposed over a first one of the plurality of fins, the channel protecting liner being further disposed over a portion of the shallow trench isolation region extending from the portion of the sidewalls of the first nanosheet stack toward a second one of the plurality of nanosheet stacks disposed over a second one of the plurality of fins;
   a plurality of gate stacks surrounding portions of the plurality of nanosheet stacks exposed by the channel protecting liner;
   at least one asymmetric self-aligned gate isolation structure disposed over the channel protecting liner; and
   at least one symmetric self-aligned gate isolation structure disposed over a portion of the shallow trench isolation region between a third one of the plurality of fins and a fourth one of the plurality of fins.

22. The integrated circuit of claim 21, wherein the asymmetric self-aligned gate isolation structure disposed over the channel protecting liner comprises:
   a first portion disposed adjacent the channel protecting liner surrounding sidewalls of the first nanosheet stack; and
   a second portion disposed over a top surface of the channel protecting liner surrounding the portion of the top surface of the first nanosheet stack.

23. The integrated circuit of claim 21, wherein the first nanosheet stack and the second nanosheet stack provide nanosheet channels for nanosheet field-effect transistors of at least one static random-access memory device structure.

24. The integrated circuit of claim 23, wherein the first nanosheet stack provides nanosheet channels for a p-type nanosheet field-effect transistor and the second nanosheet stack provides nanosheet channels for an n-type nanosheet field-effect transistor.

25. The integrated circuit of claim 23, wherein a third one of the plurality of nanosheet stacks disposed over the third fin and a fourth one of the plurality of nanosheet stacks disposed over the fourth fin provide nanosheet channels for nanosheet field-effect transistors of one or more logic device structures.

\* \* \* \* \*